United States Patent [19]
Takahashi et al.

[11] Patent Number: 5,661,343
[45] Date of Patent: Aug. 26, 1997

[54] POWER HYBRID INTEGRATED CIRCUIT APPARATUS

[75] Inventors: Masaaki Takahashi; Kazuji Yamada; Hideki Miyazaki, all of Hitachi; Kazuo Kato, Tokai-mura, all of Japan

[73] Assignee: Hitachi, Ltd., Tokyo, Japan

[21] Appl. No.: 405,791

[22] Filed: Mar. 16, 1995

[30] Foreign Application Priority Data

Mar. 16, 1994 [JP] Japan ................... 6-045367

[51] Int. Cl.[6] ............................................. H01L 23/34
[52] U.S. Cl. ................... 257/723; 257/668; 257/691; 257/725; 257/728
[58] Field of Search ........................... 257/723, 728, 257/691, 668, 708, 725, 703

[56] References Cited

U.S. PATENT DOCUMENTS

| | | | |
|---|---|---|---|
| 5,198,963 | 3/1993 | Gupta et al. | 361/386 |
| 5,206,712 | 4/1993 | Kornrumpf et al. | 361/393 |
| 5,291,065 | 3/1994 | Arai et al. | 257/723 |
| 5,424,579 | 6/1995 | Arai et al. | 257/691 |

FOREIGN PATENT DOCUMENTS

| | | | |
|---|---|---|---|
| 3195083 | 8/1991 | Japan . | |
| 536872 | 2/1993 | Japan | 257/725 |

*Primary Examiner*—Mahshid D. Saadat
*Assistant Examiner*—T. M. Arroyo
*Attorney, Agent, or Firm*—Bardehle, Pagenberg, Dost, Altenburg, Frohwitter, Geissler & Partners

[57] ABSTRACT

An input-output wiring for the power circuit and a ground layer are formed on a metal substrate of a power hybrid integrated circuit apparatus. A plurality of windows are opened at predetermined positions of a circuit substrate to which electronic parts such as an IC driver, a chip resistor etc. are connected. Ceramic chips are soldered on the exposed surface of the metal substrate in the windows, and the power semiconductor elements are connected through metal bridges on the ceramic chips. Connection between lower electrode of adjoining power semiconductor elements or between lower part of the power semiconductor element and an input/output wiring is made by means of a part of the metal bridge.

10 Claims, 6 Drawing Sheets

POWER HYBRID INTEGRATED CIRCUIT APPARATUS

BACKGROUND OF THE INVENTION

FIELD OF THE INVENTION

The present invention relates to a hybrid integrated circuit apparatus in which a power element is mounted, and more particularly to a hybrid integrated circuit apparatus with a reduced switching noise of the power element and an improved dielectric strength of wiring part of the power element.

Two kinds of circuit substrates have been used in conventional power modules in which power elements were mounted in a hybrid integrated circuit. The first substrate was a circuit substrate in which an upper surface of a metal substrate made of Cu or Al as a main component was insulated with epoxy resin or polyimide resin, etc. to which inorganic fillers such as SiO2 were added. The second one was a circuit substrate in which an upper surface of a metal substrate was insulated with ceramics.

The former was mainly used for a product of 600 V/30 A or less capacity, and the latter was used for the product that exceeds 600 V/30 A capacity.

On the other hand, there is a power module using a combined circuit substrate of the above mentioned two kinds of substrates; i.e. a circuit substrate in which an upper surface of a metal substrate is insulated with an organic films such as epoxy resin on one part and with ceramics on another part.

The power module of this type is disclosed in Japanese patent laid-open print 3-195053. The power semiconductor element is connected to the metal substrate through ceramic chips such as aluminum nitride of which heat conduction is good. Cu is used as the metal substrate.

Small signal elements such as driver IC's are connected to the wirings formed on the insulation layer coated on metal substrate 1. Polyimide resin is used as the insulating layer.

In this power module, input and output wirings of the small signal circuit and the power semiconductor element are formed on the polyimide resin. Only the power semiconductor elements are connected to the metal substrate through the ceramic chip. And, the small signal circuit and the power semiconductor element are connected to each other with aluminum wire.

Thermal dissipation can be improved by using ceramics for mounting portion of the power semiconductor element in the above power module. However, with an increase in electric current of a power semiconductor device, a noise that is generated at the time of switching and a noise from the input/output wiring may enter into the wiring formed in the vicinity of the power element.

The noise entered in the wiring for the small signal generates operation errors of a driver IC or a microcomputer.

In the power module of this type, two kinds of insulators such as ceramics and polyimide, and a collector electrode and an input/output wiring of the power semiconductor element are connected with Al wire. When this structure is applied to high power semiconductor elements, there may be a problem of an increase in wiring resistance that leads to an increased in power loss of the semiconductor element. Because a copper plate is used as a metal substrate for the power hybrid integrated circuit, soldering is easy when the ceramic chip is connected to the substrate, and heat dissipation is also good.

But, there is a problem that the weight of whole system using this hybrid integrated circuit becomes heavier since copper is heavy.

SUMMARY OF THE INVENTION

An object of this invention is to reduce noise and wiring resistance due to increase in electric current of the power semiconductor element in the power hybrid integrated circuit apparatus.

Another object of this invention is to provide a small sized and light-weight power hybrid integrated circuit apparatus.

According to the power hybrid integrated circuit apparatus of the present invention, an insulating layer made of an organic resin that is adhered to a metal substrate has a plurality of windows, wherein ceramic chips are bonded to the metal substrate through the respective windows. Metal foil are formed on the ceramic chips, and the power semiconductor elements are fixed to the respective ceramic chips through metal foils.

The conduction paths for the small signal elements are formed on the desired positions of the surface of the insulating layer and conduction paths for power semiconductor elements are formed on the other positions of the surface of the insulating layer. The electrodes of the adjoining power semiconductor elements are electrically connected with metal foils. The metal foils are the wiring material and also the electrodes for the power semiconductor elements.

If several lower electrodes of the power semiconductor element are connected, metal foils are bonded in the form of bridge like on the surface of the respective divided ceramic chips and a part of the metal foil is connected to the input/output wirings.

Even if the lower electrodes of the power semiconductor elements are independent, metal foil is inserted between the power semiconductor chip and the ceramic chip, and part of this metal foil is connected to input/output wiring.

According to a preferred aspect of the present invention, an organic multi-layered film is used as an insulating material other than the ceramic chips for mounting the power semiconductor element and small signal wirings such as signal lines are formed inside of the multi-layered film and ground layers are formed on the main surfaces thereof, thereby to eliminate the noise.

Input/output wiring can be formed on a part of the surface of the above multi-layered film. And, as for the material of the this multi-layered film, epoxy resin or the polyimide resin is selected, and it is desirable to bond the resin material to a metal substrate with an adhesive agent. Al or Al alloy is used as the metal substrate to decrease the weight of the module. Because direct blazing of the Al or Al alloy and the ceramic chip is difficult, the Al oral alloy are covered with plating films such as Ni and Cu to modify the surface of the Al or Al alloy to be blazed.

Since the surface of Al or Al alloy is covered with oxide film, it is generally difficult to form a plating film thereon. According to a preferred aspect of the present invention, the surface of Al or Al alloy is etched to remove oxide film and the surface thereof is chemically substituted with zinc. Then Ni plating film is formed on the zinc film to make a blazable surface (Zn substitution method). According to the power hybrid integrated circuit apparatus of the present invention the apparatus comprises a metal substrate, an insulator layer bonded on the metal substrate and having a plurality of windows, a plurality of ceramic chips which are fixed on the metal substrate in respective areas of the windows, a metal foil which is formed on each of the ceramic chips, a plurality of power semiconductor elements which are fixed through the metal foil on the plurality of ceramic chips, a plurality of small signal circuit elements which are fixed at predetermined positions on the surface of the insulator layer, a conduction path for each of the power semiconductor elements which is formed at other predetermined position on the surface of the insulator layer, wherein electrodes of the adjoining power semiconductor elements are electrically connected by the metal foil. According to the power hybrid integrated circuit apparatus of the present invention, the apparatus comprises a metal substrate, an insulator layer bonded on the metal substrate and having a plurality of ceramic chips which are fixed on the metal substrate in respective areas of the windows, a metal foil which is formed on each of the ceramic chips, and above said insulator layer in the form of a bridge, a plurality of power semiconductor elements which are fixed through the metal foil on the plurality of ceramic chips, wherein electrodes of said adjoining power semiconductor elements are electrically connected by said metal foil. According to the power hybrid integrated circuit apparatus of the present invention the apparatus comprises an insulator layer bonded on the metal substrate having a plurality of windows, a plurality of ceramic chips which are fixed on the metal substrate in respective areas of the windows a plurality of power semiconductor elements which are fixed on the plurality of ceramic chips, a plurality of small signal circuit elements which are fixed at predetermined positions on the surface of the insulator layer wherein wiring for the small signal circuit elements is formed inside of the insulator layer, and a ground layer is formed on both main plans of the insulator layer.

In the present invention, if several lower electrodes of the power semiconductor element are connected, metal foils are attached like bridge on each of the surfaces of the divided ceramic chips, and a part of the above metal foil is connected to the input/output wiring. Even if lower electrodes of the power semiconductor element is independent from each other, metal foils are inserted between the power semiconductor elements and the ceramic chips, and parts of the metal foils are connected to the input/output wiring.

Metal foils are bonded to the surface of the ceramic chips by a direct bonding method or activated metal method, and parts of the above metal foils are connected to the input/ output terminal to attain an electric conduction. As a result, the cross section increases, compared with the case where ceramic chips and the semiconductor element are connected withal wire. Therefore, the loss of the semiconductor element can be neglected. And, the number of Al wires can be reduced.

On the other hand, a noise that is generated in the power semiconductor element at the time of switching on or off of a large electric current or a noise that enters in small signal lines from the input/output wiring can be absorbed as follows. The small signal lines are formed in the multi-layered film and a ground layer is formed on the surface of the film so that the noise is released into the ground layer.

DESCRIPTION OF THE PREFERRED EMBODIMENTS

Figure 1:
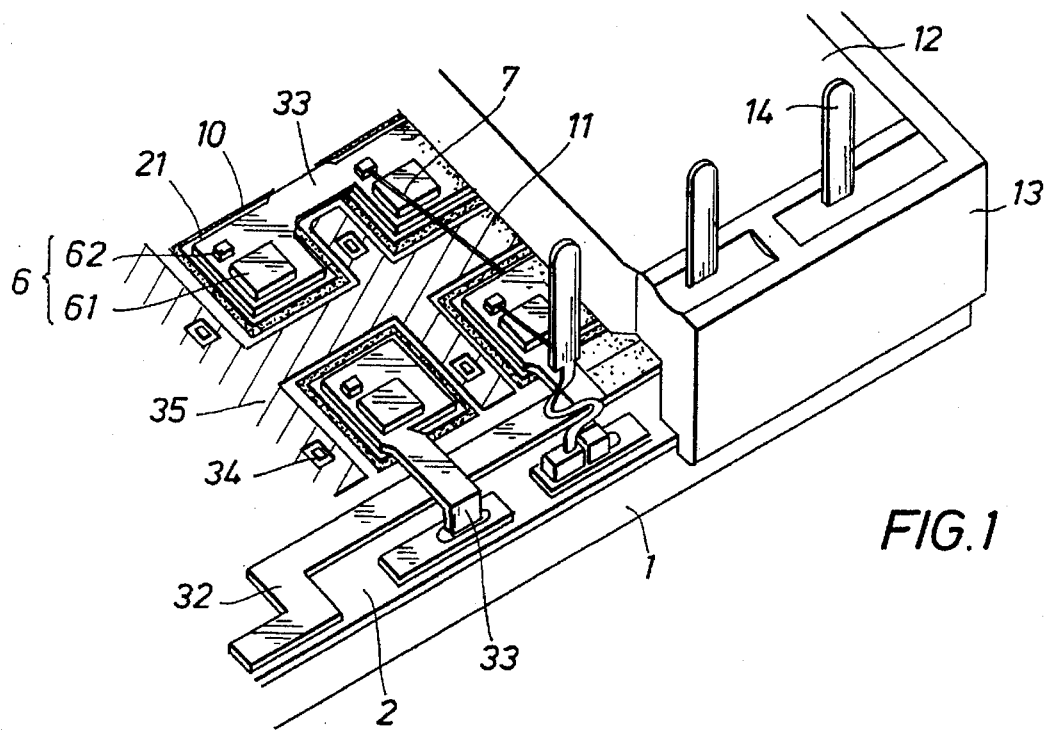
FIG. 1 is a perspective view for explaining an example of this invention.

FIG. 1 is a partially broken perspective view of the hybrid integrated circuit of this invention, where parts of resin case 13, external terminals 14, packaging resin 12 and gel 11 are removed. In the hybrid integrated circuit of this invention, metal substrate 1 is covered with circuit substrate 2. Window 21 that penetrates to the surface of metal substrate 1 is formed at desired positions of circuit substrate 2. Ceramic chip 10 is bonded to the exposed surface of metal substrate 1. Ceramic chip 10 consists of aluminum nitride with good thermal conductivity.

In order to connect the collector electrodes of the power semiconductor element 6 or to connect the collector electrode and input/output conduction path 32 for power circuit, metal bridge 33 is adhered to the surface of aluminum nitride. The power semiconductor element is fixed on the above metal bridging.

To circuit substrate 2, adhered is input/output wiring 32 of the conduction path for the above power circuit, and pads 34 for ground layer 35 or input/output of the gate signal are formed as well. Circuit substrate 2 is a multilayered board made of epoxy resin, polyimide resin, etc., and is fixed to the metal substrate 1 with an adhesive agent.

Figure 2:
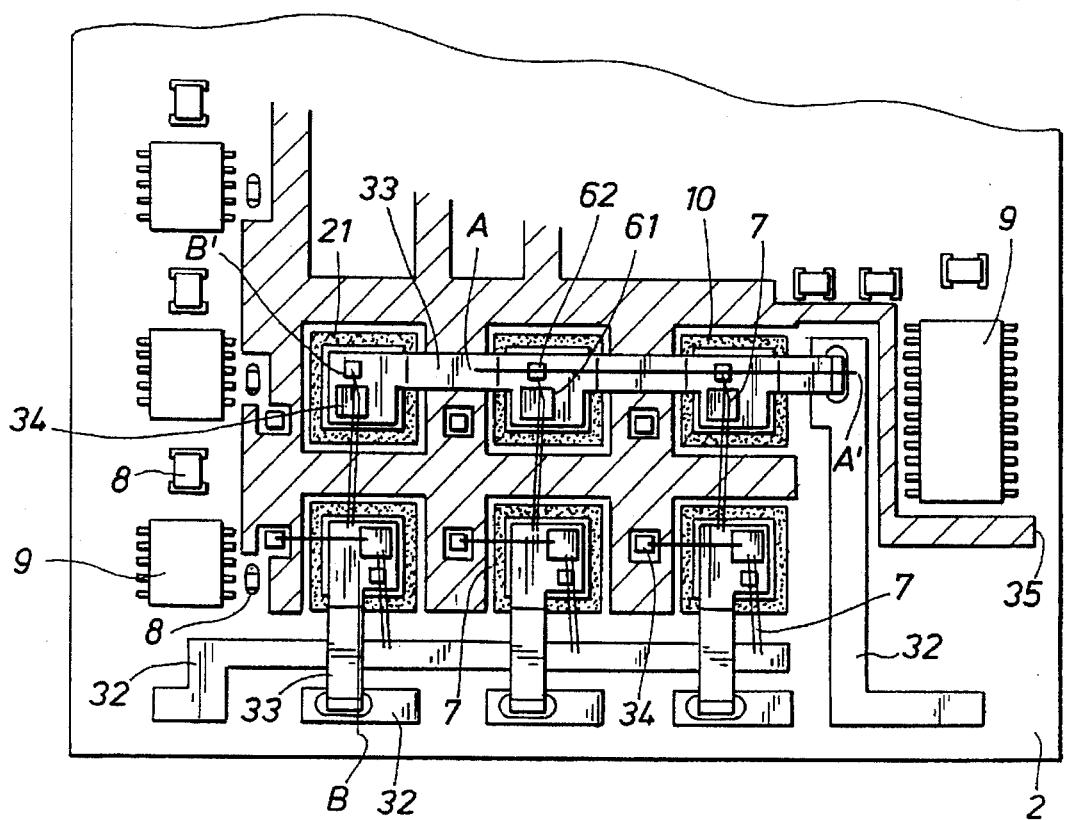
FIG. 2 is a plan view of an example shown in FIG. 1.

The signal lines that comprise via-holes or inner leads are formed in the inside of circuit substrate 2. FIG. 2 shows the inside of the hybrid integrated circuit shown in FIG. 1.

A plurality of windows 21 are formed in circuit substrate 2. Power semiconductor element 6 is fixed through ceramic chip 10 to the exposed surface of metal substrate 1 within the window.

Connection between the collector electrodes of the power semiconductor element 6 and connection between the collector electrode of the power semiconductor element 6 and conduction path comprising the input/output wiring 32 of power circuit are accomplished with metal bridge 33.

The Al wires 7 are used for a connection between the upper electrode of power semiconductor element 61 (IGBT, etc.) and that of the adjacent high-speed diode 62 and a connection between the upper electrode and the lower electrode of the power semiconductor element 61. On the surface of the circuit substrate 2 in the vicinity of input/ output wiring 32 of the conduction path for the power circuit, not formed is wiring for the small circuit but formed is ground layer 35.

The gate signal electrode of power semiconductor elements 61 such as IGBT and pad 34 formed on the surface of circuit substrate 2 are connected to each other with Al wire 7. This pad 34 serves as to transmit the signal from control circuit comprising driver IC 9 etc. to power semiconductor element 61 such as IGBT.

Figure 3:
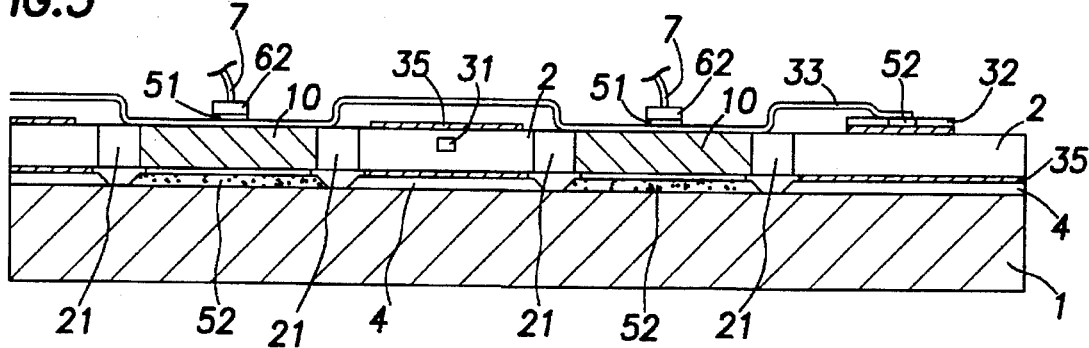
FIG. 3 is a cross sectional view along with A-A' line of FIG. 2.

Control driver IC 9 and electronic parts such as resistor chip 8 are connected to pad 34 by inner leads or conducting path for small signal circuit (not shown). FIG. 3 is an A-A' sectional view of FIG. 2. wherein the lower electrodes, i.e. collector electrodes of the adjoining power semiconductor elements are connected. Circuit substrate 2 having window 21 at the mounting part of the power semiconductor element is adhered to metal substrate 1 with adhesive agent 4.

Conducting path for small signal circuit 31 or ground layer 35 is formed in the inside of circuit substrate 2.

The surface of metal substrate 1 is exposed in the window formed in the above circuit substrate, and ceramic chip 10 is bonded to the exposed surface with low temperature solder 52.

Power semiconductor elements 62 such as high speed diode are connected with high-temperature solder 51 on metal bridge 33. Part of the metal bridge is connected by conduction path 32 for the power circuit and low temperature solder 52.

Figure 4:
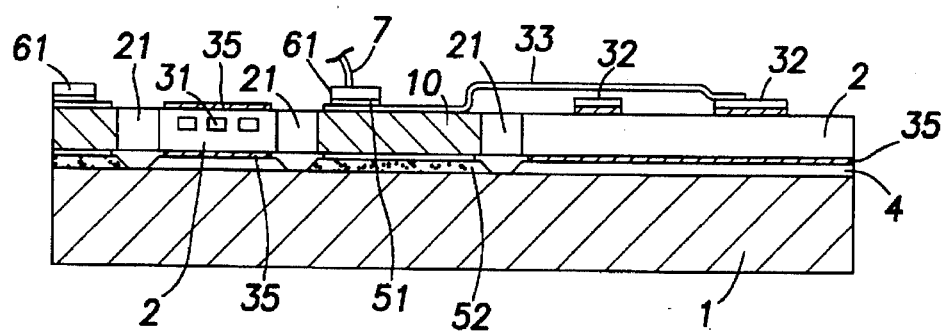
FIG. 4 is a cross sectional view along with B-B' line of FIG. 2.

FIG. 4 is the B-B' sectional view of FIG. 2 showing the part where the collector electrode of power semiconductor element 6.1 is connected to conducting path for power circuit 32 through metal bridge 33.

In the same way as in FIG. 3, ceramics 10 is bonded by low melting point solder 52 and the multi-layered substrate is bonded by adhesive. And, at the crossing points of the conduction paths for power circuit, the metal bridge is bent to avoid electrical connection of conduction paths.

Figure 5:
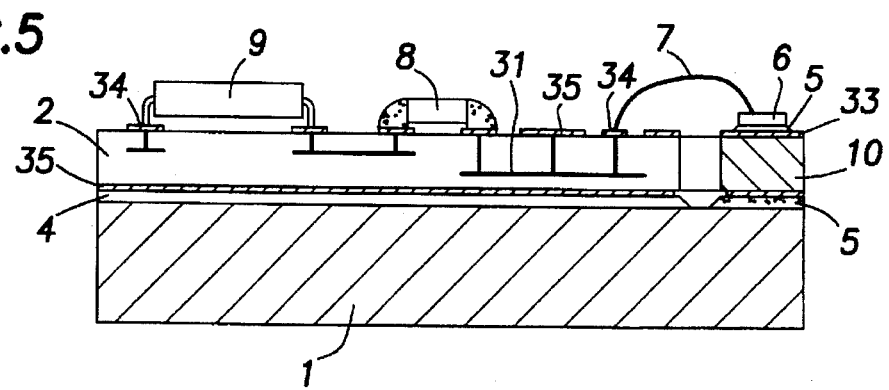
FIG. 5 is a cross sectional view of the part of the small signal circuit shown in FIG. 2.

FIG. 5 illustrates the structure in the vicinity of the circuit substrate on which the power semiconductor element is mounted. FIG. 5 explains the sectional view of the small signal circuit part on which the driver IC and resistor chips parts are mounted.

This part of circuit substrate 2 is a part to control the power semiconductor element, and electronic parts such as driver IC 9 and resistor chip 8 are mounted by face-bonding on its surface. And, the electronic parts such as driver IC 9 and resistance chip 8 are soldered to pad 34 formed on the surface of the circuit substrate.

The conduction paths for the small signal circuit are not formed in circuit substrate 2. The electronic parts such as the above driver IC for controlling power semiconductor elements 61 such as IGBT and the resistor chip are connected by conduction paths 31 such as the inner leads and via-holes formed in the inside of circuit substrate 2.

Ground layers 35 formed on the surface or the rear surface of circuit substrate 2 are connected mutually at desired positions and are connected to parts of the external terminals.

Figure 6A:
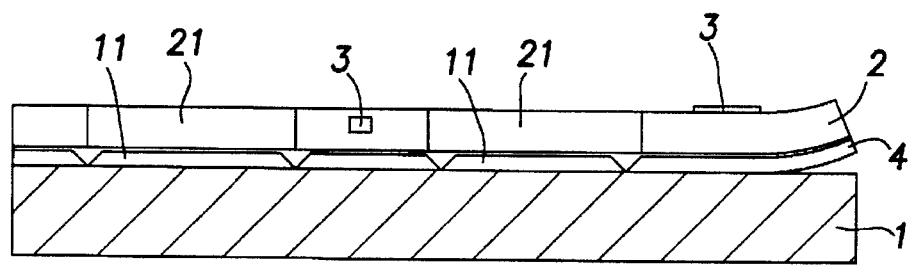
FIGS. 6A and 6B show an example of the manufacturing process of the power hybrid integrated circuit apparatus of this invention.
Figure 6B:
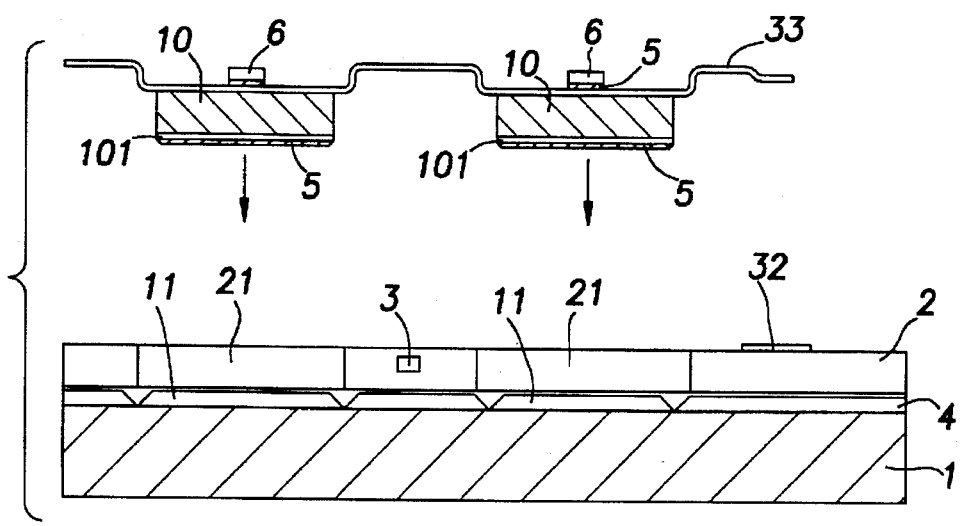

FIGS. 6A and 6B explain the manufacturing process of the power hybrid integrated circuit apparatus of this invention. In FIG. 6A, the multi-layered substrate such as printed circuit boards in which windows 21 or conduction paths 3 are formed is bonded to metal substrate 1 made of aluminum, etc. with an adhesive agent 4. In FIG. 6A, metal film 11 made of nickel, for example, is formed on the exposed metal surface in the window 21 of circuit substrate 2. Solder 5 fixes power semiconductor element 6 is fixed to the surface of metal bridge 33 in FIG. 6B.

Ceramic chip 10 coated with metallized layer 101 is bonded to the rear surface of metal bridge 33. Spare solder 5 is put on the part of metallized layer 101 of ceramic chip 10.

Ceramic chip 10 on which power semiconductor element 6 is fixed is adjusted on the exposed surface of metal substrate 1 in the window and is melted again to effect bonding.

Figure 7A:
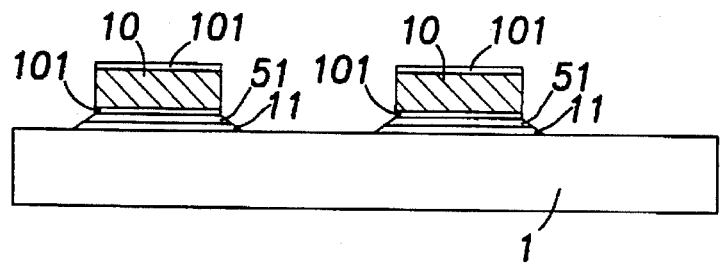
FIGS. 7A to 7C show another example of the manufacturing process of the power hybrid integrated circuit apparatus of this invention.
Figure 7B:
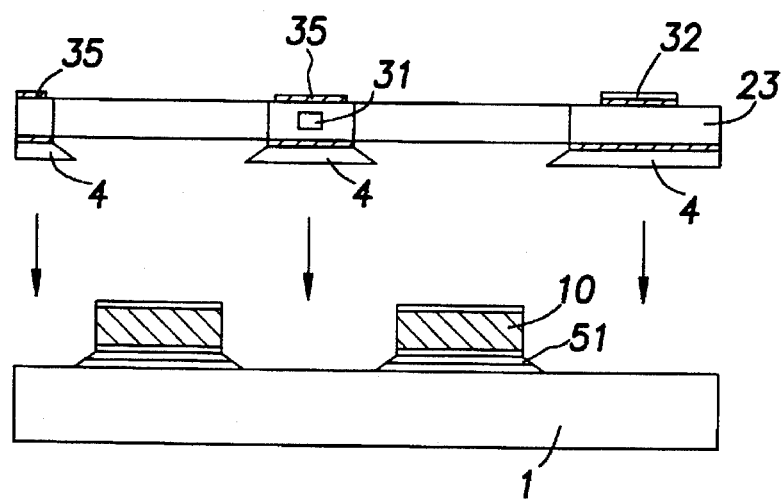
Figure 7C:
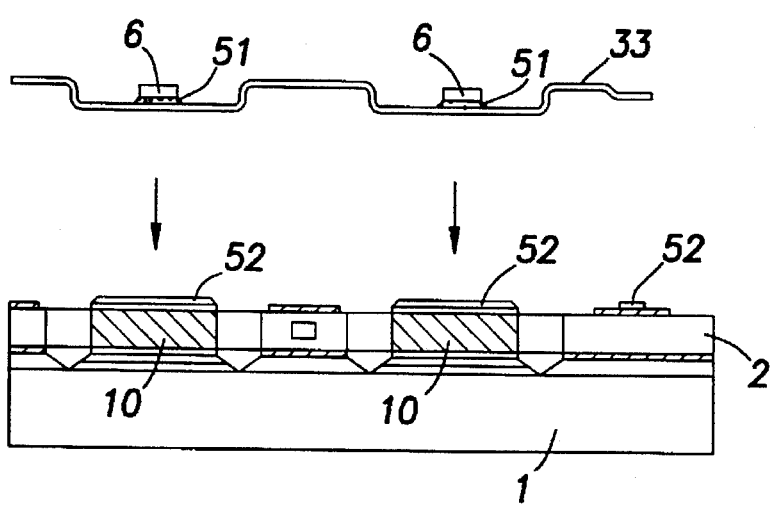

FIGS. 7A to 7C explain another example of the manufacturing processes of the power hybrid integrated circuit equipment of this invention. In FIG. 7A, ceramic chip 10 is bonded on metal substrate 1 by solder. At this time, high melting point solder 51 is used.

Then, in FIG. 7B, multi-layered substrate 23 such as printed circuit board in which circuits of inner wirings, etc. and windows are formed is attached with an adhesive agent to metal substrate 1 on which ceramic chips 10 are fixed as shown in FIG. 7A. Further, in FIG. 7C, metal bridge 33 to which power semiconductor element 6 is bonded in advance is fixed by low melting point solder 52 to circuit substrate 1 to which ceramics chips 10 and multi-layered substrate 23 having circuit wiring are bonded. Circuit substrate 1 is bonded to metal bridge 33 by low melting point solder 52. The two manufacturing processes have been described in the above.

Two insulating substrates are used in the both examples of this invention. That is, the power semiconductor elements are fixed on the ceramic chips and the wiring circuit including the small signal circuit are formed on the multi-layered substrate made of organic resins.

And, each of the ceramic chips has such a size that one or a pair of power semiconductor elements are fixed thereon. Each of the ceramic chips is bonded on the metal substrate independently. And then, connecting between each power semiconductor element or between the power semiconductor element and the power conduction path of the input/ output wiring, etc. are performed by means of the metal bridge inserted between the ceramic chip and the power semiconductor element.

According to these structures, heat generated in the semiconductor element that can be dissipated promptly to the metal substrate. And, the heat of the semiconductor element is not transmitted to the small signal circuit, etc. As mentioned above, the power hybrid integrated circuit of this invention comprises two kinds of insulating materials.

The circuit can be manufactured by a method that is different from that shown in FIG. 6. That is, the power circuit is prepared at first, then a controlling circuit using an organic resin is bonded to the power circuit.

Figure 8A:
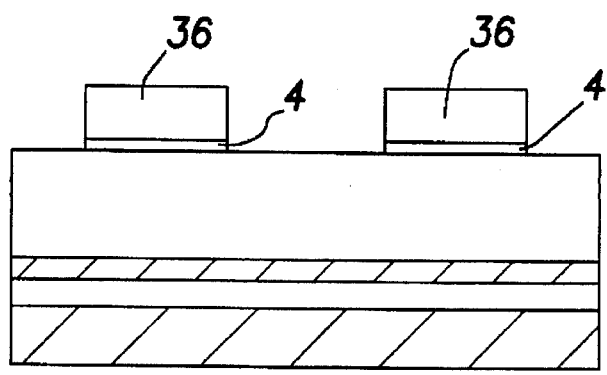
FIGS. 8A to 8C show the structures of the conduction paths for the input and output wiring.
Figure 8B:
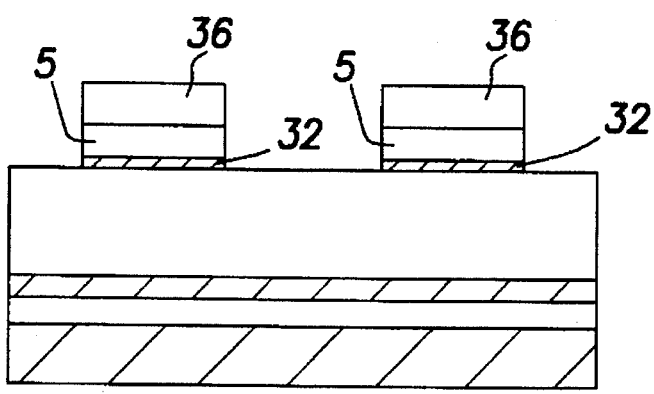
Figure 8C:
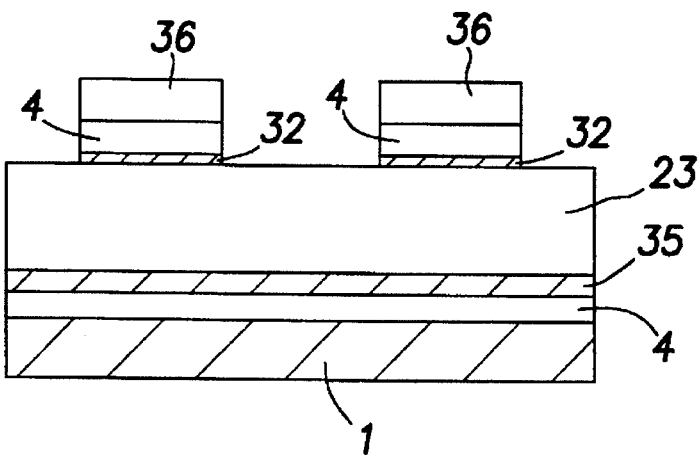

FIGS. 8A, 8B and 8C explain the cross sectional structures of the conduction paths for input/output wiring of the power semiconductor element. This conduction path unlike the conduction path for the small signal circuit is preferable to have an electric resistance as small as possible to avoid the loss of the semiconductor element. The cross sectional area of the wiring part should be made large. But it is difficult to enlarge the surface area of the conduction path because the size of the circuit substrate is limited. Therefore, the three structures are proposed by this invention.

In the structure shown in FIG. 8A, relatively thick metal foil 36 of copper or of copper—aluminum alloy is adhered to multi-layered substrate 23 with adhesive agent 4. Metal foil 36 is formed into a desired shape by pressing, punching or etching, etc. This metal foil is bonded with adhesive agent to a position of multilayer substrate 23 having conduction paths for small signal that is formed in advance.

In the structures shown in FIGS. 8B and 8C, input/output wiring for the power or for the small signal is formed in advance in multilayer substrate 23. Metal foil 36 is bonded by solder 5 or adhesive agent 4 on its conduction path 32, after formation of conduction path 32 of input/output wiring for the power on the surface of multilayer substrate 23. The metal foil is prepared in the same manner as in the above process. The cross sectional area of the conduction path of the power circuit could be made large by these structures, without increasing the surface area and the loss of the semiconductor element could be reduced.

Figure 9A:
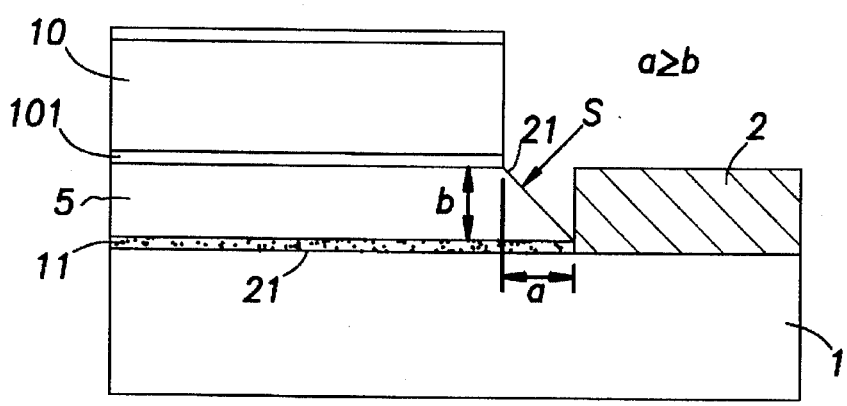
FIGS. 9A and 9B explain the relationship between the size of the window formed on the circuit substrate and the size of the ceramic chip.

FIG. 9 explains the size of window 21 formed on circuit substrate 2 where conduction paths for the small signal circuit or the power circuit are formed. In order to compact the power hybrid integrated circuit apparatus of this invention, it is desirable that the size of the window formed on circuit substrate 2 is almost equal to the size of ceramic chip 10. However, there may be an anxiety that solder layer 5 or metallized layer 101 for bonding ceramic chips 10 to metal substrate 1 or metal layer 11 for blazing which is formed on the surface of metal substrate 1 are destroyed because the thermal expansion coefficient of ceramic chip 10 and that of metal substrate 1 are generally different.

Figure 9B:
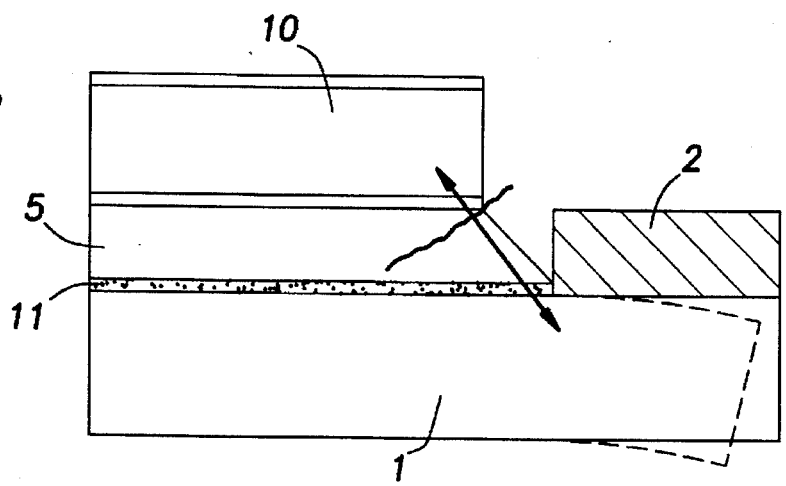
Figure 10:
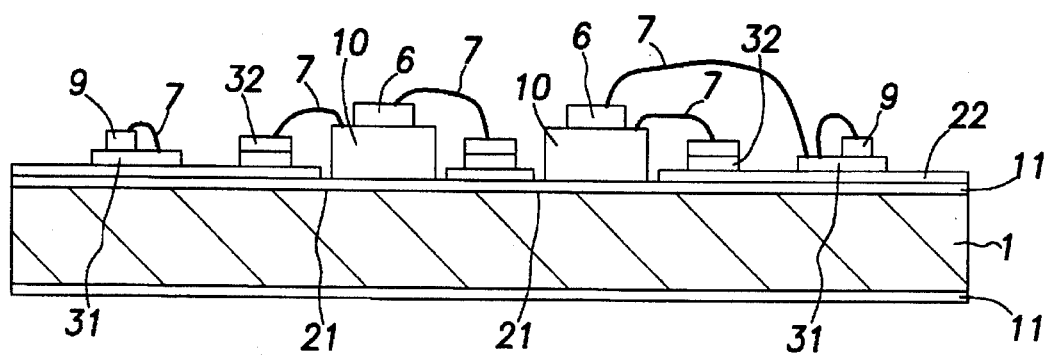
FIG. 10 explains a prior art.

This cause is as follows: as shown in FIG. 9B, stress occurs in the direction of the arrow when metal substrate 1 having a large thermal expansion coefficient and ceramic chips 10 shrink and are deformed after bonding them. This stress is the force that tears the both at the connection part of metal substrate 1 and ceramic chips 10.

Since solder 5 is soft metal, it deforms more easily than other metals. Therefore, the stress may be reduced by increasing the thickness of the solder layer or making a slope of the ridge smaller, because an edge distance c of the soldered portion is extended. However, such a structure that solder layer 5 is thick may not be preferable as a heat dissipating structure because the thickness of the solder is much smaller than a thickness of a structure part such as aluminum nitride ceramics chip or a metal substrate.

In this example, instead of extending of the edge distance c between metal substrate 1 and ceramic chip 10 by increasing the thickness of the solder layer, the bonding area of solder 5 is made larger than the cross sectional area of ceramic chip 10 to extend the edge distance.

In this example, a stress relief structure is adopted wherein ridge part of wet-spreading of solder on the surface of metal substrate 1 is gentle as much as possible. Edge distance c of the solder at an end of the connection part was enlarged to reduce stress.

According to the experiment, it was found that when width a of the solder spreading part on the surface of metal substrate 1 is made smaller than thickness b of solder 5, the stress applied to edge face S of the solder end part becomes large and destruction occurs in relatively short time.

On the other hand, when width a of the solder spread part is made larger than thickness b of solder, destruction does not occur for a long time. Spread part a of solder can not be made extremely large, because miniaturization is prevented. From the view point of life time, a proper width a of the solder spread part is about 1 to 1.5 times the thickness b of solder.

The area of window 21 formed on circuit substrate 2 should be a total of the spread area of solder and the area of ceramic chip 10. As a result, the area of the wetted spread of solder is restricted by the area of the window formed on circuit substrate 2. Therefore, it was possible to decrease the scattering of the thickness of the solder so as to prevent a bad appearance of the solder.

As has been described above, the hybrid integrated circuit has the following advantages.

Only power semiconductor elements that generate heat are mounted on ceramic chips that are bonded by solder to a metal substrate. Conduction paths for power circuit and small signal circuit are formed on a multi-layered substrate made of organic resin. As a result, heat dissipation characteristics of power semiconductor element can be improved.

The wiring density can be increased, and the size of the power hybrid integrated circuit can be made small.

In the conventional conduction paths for the small signal circuit were formed only on the surface of the substrate. The resin multi-layered substrate is used in this invention. A major part of wiring parts except the connection parts for electronic parts are formed in the inside of the resin multi-layered substrate and the ground layer is formed on the surface of the wiring. As a result the noise from the power circuit can be greatly reduced.

A shape and manufacturing process of the conduction paths for power input/output wiring are different from those of the conduction paths for the small signal circuit. Therefore conductor resistance can be reduced and lowering of efficiency of the semiconductor due to voltage drop in wiring can be prevented.

A plurality of power semiconductor element are separated and insulated from each other by the ceramic chips.

The metal bridge of metal foil is used for the connection between under electrodes or the connection between power semiconductor element and input/output wiring. Therefore, it is possible to avoid an increase of cost caused by the complicated manufacturing process of the conventional hybrid integrated circuit using aluminum wire. And, it is possible to reduce conductor resistance.

What is claimed is:

1. A power hybrid integrated circuit apparatus comprising:

a metal substrate, a resin layer formed on the metal substrate and having a plurality of windows, wherein a surface of said metal substrate is exposed in the windows, a plurality of ceramic chips mounted on the surface of said metal substrate in respective areas of said windows, a plurality of power semiconductor elements mounted on said plurality of ceramic chips, wherein said plurality of electrodes of adjoining said power semiconductor elements are electrically connected by a metal foil formed above said resin layer in the form of a bridge, a plurality of control circuit elements mounted on the surface of said resin layer, and a conduction path for said control circuit elements formed on the surface of said resin layer.

2. The power hybrid integrated circuit apparatus as defined in claim 1, wherein a conduction path for said power semiconductor elements is formed on said resin layer, and said power semiconductor elements and said conduction paths for said power semiconductor elements are electrically connected by said metal foils formed on said ceramic chips to which said power semiconductor elements are mounted.

3. The power hybrid integrated circuit apparatus as defined in claim 1, wherein wiring for said control circuit elements is formed inside of said resin layer, and a ground layer is formed on both main plans of said resin layer.

4. The power hybrid integrated circuit apparatus as defined in claim 2, wherein said resin layer comprises a multilayered film.

5. The power hybrid integrated circuit apparatus as defined in claim 1, wherein said metal substrate is formed of Al or Al alloy.

6. The power hybrid integrated circuit apparatus as defined in claim 4, wherein a metal film is formed on the surface area of said metal substrate to which said ceramic chips are bonded.

7. The power hybrid integrated circuit apparatus as defined in claim 6, wherein a metal film formed on the surface of said metal substrate is of nickel—phosphorus or nickel—boron alloy.

8. The power hybrid integrated circuit apparatus as defined in claim 6, wherein a metal film formed on the surface of said metal substrate is a laminated film of one of a nickel—phosphorus film and a nickel—boron film and one of gold film and a copper film.

9. The power hybrid integrated circuit apparatus as defined in claim 1, wherein said resin layer is of epoxy resin or polyimide system resin that contains a powder or a fiber of alumina, glass, boron nitride or aluminum nitride.

10. The power hybrid integrated circuit apparatus as defined in claim 1, wherein said control circuit element contains at least one of a driver IC for controlling said power semiconductor elements, a chip resistor, a chip capacitor and a photo coupler.

* * * * *